United States Patent
Kuroda et al.

(10) Patent No.: US 6,933,753 B2
(45) Date of Patent: Aug. 23, 2005

(54) SENSOR SIGNAL OUTPUT CIRCUIT

(75) Inventors: Keisuke Kuroda, Osaka (JP); Takeshi Uemura, Osaka (JP); Toshiyuki Nozoe, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/490,729

(22) PCT Filed: Aug. 1, 2003

(86) PCT No.: PCT/JP03/09791

§ 371 (c)(1),
(2), (4) Date: Mar. 24, 2004

(87) PCT Pub. No.: WO2004/015857

PCT Pub. Date: Feb. 19, 2004

(65) Prior Publication Data

US 2004/0239375 A1 Dec. 2, 2004

(30) Foreign Application Priority Data

Aug. 7, 2002 (JP) ........................................ 2002-229755

(51) Int. Cl.[7] ........................... H03K 5/22; H03K 5/153
(52) U.S. Cl. ............................. 327/65; 327/67; 327/87; 327/89
(58) Field of Search ........................ 327/65, 331, 332, 327/66, 67, 77, 78, 79, 80, 81, 87, 88, 89, 309, 312, 316; 330/253, 254, 260

(56) References Cited

U.S. PATENT DOCUMENTS

| | | | | |
|---|---|---|---|---|
| 4,401,901 A | * | 8/1983 | Ochi | 327/89 |
| 4,625,131 A | * | 11/1986 | Kasperkovitz et al. | 327/308 |
| 4,789,799 A | * | 12/1988 | Taylor et al. | 327/309 |
| 6,633,191 B2 | * | 10/2003 | Hu | 327/323 |

FOREIGN PATENT DOCUMENTS

| | | |
|---|---|---|
| JP | 62-112070 A | 5/1987 |
| JP | 03-192907 A | 8/1991 |
| JP | 08-111616 A | 4/1996 |
| JP | 10-002915 A | 1/1998 |

OTHER PUBLICATIONS

English translation of International Search Report for PCT/JP03/09791, dated Nov. 18, 2003.

* cited by examiner

*Primary Examiner*—Tuan T. Lam
(74) *Attorney, Agent, or Firm*—RatnerPrestia

(57) ABSTRACT

A sensor signal output circuit includes a first differential amplifier, a first load resistor, a first transistor, a second transistor and a limiter section. The limiter section includes at least a second differential amplifier, which includes an input end coupled to output terminal and an other input end coupled to second reference voltage setting part, a second load resistor for a second differential amplifier, and a third transistor, which includes a gate connected to an output end of the second differential amplifier and a source connected to a gate of the second transistor.

10 Claims, 7 Drawing Sheets

US 6,933,753 B2

SENSOR SIGNAL OUTPUT CIRCUIT

THIS APPLICATION IS A U.S. NATIONAL PHASE APPLICATION OF PCT INTERNATIONAL APPLICATION PCT/JP03/009791.

TECHNICAL FIELD

The present invention relates to a sensor signal output circuit used, for example, in a sensor which detects acceleration, angular velocity, pressure or the like.

BACKGROUND ART

A sensor for detecting acceleration, angular velocity, pressure or the like generally includes a transducing element for converting the amount of displacement of an object to be detected into an electric signal, and a circuit which electrically amplifies the weak electric signal output from the element for output. The known sensor signal output circuit is illustrated by FIG. 7.

In FIG. 7, first differential amplifier 26 is formed of transistors 1, 2 having their respective sources connected to each other, and constant current source 20 connected between the sources of transistors 1, 2 and first power supply terminal 33. The electric signal from the sensor is input to a gate of transistor 1, and first reference voltage setting part 28 is provided at a gate of transistor 2.

First load resistor 30 is an active load for first differential amplifier 26. This load resistor 30 is formed of diode-connected transistor 3, and transistor 4 having its gate connected to a gate of transistor 3. The gate and a drain of transistor 3 are connected to a drain of transistor 1, while a source of this transistor 3 is connected to second power supply terminal 34. Transistor 4 has a drain connected to a drain of transistor 2, and a source connected to second power supply terminal 34.

First transistor 5 for preamplification has a gate connected to the drain of transistor 2, a source coupled to second power supply terminal 34 via first constant current source 21, and a drain connected to first power supply terminal 33. The drain of transistor 2 provides an output of first differential amplifier 26.

Second transistor 6 for output has a gate connected to the source of first transistor 5, a source connected to second power supply terminal 34 and a drain coupled to first power supply terminal 33 via second constant current source 22. The drain of second transistor 6 is also connected to output terminal 32.

In this sensor signal output circuit, the sum of current flowing from the drain of transistor 3 to the drain of transistor 1 and current flowing from the drain of transistor 4 to the drain of transistor 2 is maintained, so that as the signal input to the gate of transistor 1 increases, drain voltage of transistor 2 or the output of first differential amplifier 26 increases accordingly. Since the gate of first transistor 5 is at the same potential as the drain of transistor 2, source voltage of first transistor 5 increases. This increase in the source voltage of first transistor 5 results in a decrease in drain voltage of second transistor 6, whereby output voltage of output terminal 32 decreases.

When a break in a wire or a short circuit to first power supply terminal 33 occurs in transmission of the output voltage to a receiving circuit through use of the wire, the following problem occurs.

Although the voltage input to the receiving circuit is equal to a potential of first power supply terminal 33, with only this output circuit, a determination cannot be made as to whether this input voltage is a normal output of the sensor or a voltage resulting from the break in the wire or the short circuit to first power supply terminal 33. Accordingly, another circuit has been required for detecting the short circuit.

DISCLOSURE OF THE INVENTION

A sensor signal output circuit includes:

a first differential amplifier including an input end connected to a first reference voltage setting part, and an other input end to which a signal is input;

a first load resistor for the first differential amplifier;

a first transistor including a gate connected to an output end of the first differential amplifier, and a source connected to a first constant current source;

a second transistor including a gate connected to a point of connection between the first constant current source and the first transistor, and a drain connected to a second constant current source;

an output terminal connected to the drain of the second transistor; and a limiter section, the limiter section including at least:

a second differential amplifier including an input end coupled to the output terminal, and an other input end coupled to a second reference voltage setting part;

a second load resistor for the second differential amplifier; and a third transistor including a gate connected to an output end of the second differential amplifier, and a source connected to the gate of the second transistor.

DETAILED DESCRIPTION OF THE PREFERRED EMBODIMENTS

Exemplary embodiments of a sensor signal output circuit according to the present invention are demonstrated hereinafter with reference to the accompanying drawings. It is to be noted that a sensor is used as means for inputting a signal to the sensor signal output circuit.

(First Exemplary Embodiment)

The first exemplary embodiment is described with reference to FIG. 1.

First, a description is provided of the structure of a sensor signal output circuit of the present embodiment.

Figure 1:
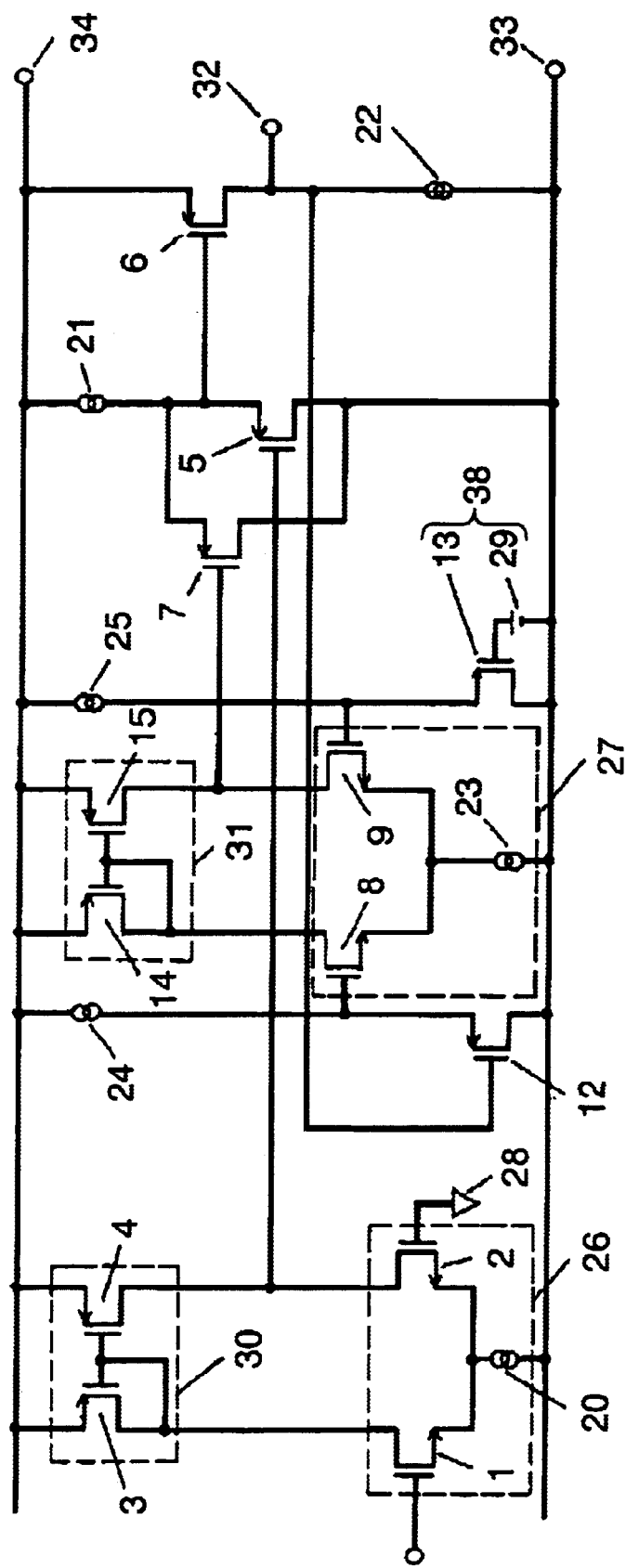
FIG. 1 is a diagram of a sensor signal output circuit in accordance with a first exemplary embodiment of the present invention.

In FIG. 1, first differential amplifier 26 is formed of transistors 1, 2 having their respective sources connected to each other, and constant current source 20 connected between the common sources of transistors 1, 2 and first power supply terminal 33. A signal from a sensor is input to a gate of transistor 1, and first reference voltage setting part 28 provides a first reference voltage to a gate of transistor 2.

First load resistor 30 is an active load for first differential amplifier 26. This load resistor 30 is formed of diode-connected transistor 3, and transistor 4 having its gate connected to a gate of transistor 3. The gate and a drain of transistor 3 are connected to a drain of transistor 1, while a source of this transistor 3 is connected to second power supply terminal 34. Transistor 4 has a drain connected to a drain of transistor 2, and a source connected to second power supply terminal 34.

First transistor 5 for preamplification has a gate connected to the drain of transistor 2, a source coupled to second power supply terminal 34 via first constant current source 21, and a drain connected to first power supply terminal 33. The drain of transistor 2 provides an output of first differential amplifier 26.

Second transistor 6 for output has a gate connected to the source of first transistor 5, a source connected to second power supply terminal 34, and a drain connected to output terminal 32 and coupled to first power supply terminal 33 via second constant current source 22.

Second differential amplifier 27 is formed of sixth and seventh transistors 8, 9 having their respective sources connected to each other, and third constant current source 23 connected between the sources of sixth and seventh transistors 8, 9 and first power supply terminal 33. A gate of sixth transistor 8 is coupled to second power supply terminal 34 via constant current source 24 and connected to a source of output monitoring transistor 12. Transistor 12 has a drain connected to first power supply terminal 33, and a gate connected to output terminal 32.

A gate of seventh transistor 9 is coupled to second power supply terminal 34 via constant current source 25 and connected to a source of fourth transistor 13 of second reference voltage setting part 38. Fourth transistor 13 has a drain connected to first power supply terminal 33, and a gate connected to second reference voltage 29, which is a limit voltage.

Second load resistor 31 is an active load for second differential amplifier 27. This second load resistor 31 is formed of diode-connected transistor 14, and transistor 15 having its gate connected to a gate of transistor 14. The gate and a drain of transistor 14 are connected to a drain of sixth transistor 8, while a source of this transistor 14 is connected to second power supply terminal 34. Transistor 15 has a drain connected to a drain of seventh transistor 9, and a source connected to second power supply terminal 34.

Output limiting third transistor 7 has a gate connected to the drain of seventh transistor 9, a source connected to the source of first transistor 5, the gate of second transistor 6 and first constant current source 21, and a drain connected to first power supply terminal 33. The drain of seventh transistor 9 provides an output of second differential amplifier 27.

A limiter section is formed of at least third transistor 7, second differential amplifier 27 and second reference voltage setting part 38.

A description is provided next of the operation of the sensor signal output circuit having the above structure.

The sum of current flowing from the drain of transistor 3 to the drain of transistor 1 and current flowing from the drain of transistor 4 to the drain of transistor 2 is maintained, so that as the signal input to the gate of transistor 1 increases, drain voltage of transistor 2 or the output of first differential amplifier 26 increases accordingly. Since the drain of transistor 2 and the gate of first transistor 5 are at the same potential, source voltage of first transistor 5 increases, and drain voltage of second transistor 6 decreases. Consequently, output voltage of output terminal 32 decreases.

If the output voltage is lower than second reference voltage 29 or the limit voltage, the decrease in the output voltage results in a decrease in gate voltage of transistor 12, and in synchronization with the gate voltage of transistor 12, gate voltage of sixth transistor 8 decreases.

Second reference voltage 29 which is the limit voltage applied to the gate of fourth transistor 13 is applied as a gate voltage of seventh transistor 9.

For this reason, drain voltage of seventh transistor 9 or the output of second differential amplifier 27 and gate voltage of third transistor 7 decrease. In synchronization with the gate voltage of transistor 7, source voltage of transistor 7 and gate voltage of second transistor 6 decrease, whereby the drain voltage of second transistor 6 increases to second reference voltage 29 or the limit voltage.

In this way, the output voltage does not fall short of second reference voltage 29, but is maintained at second reference voltage 29 even when the input voltage such as to cause the output voltage to fall short of second reference voltage 29 is input. It is to be noted here that first and third transistors 5, 7 have their respective sources connected to each other and their respective drains connected to each other, thus having the common source voltage, so that third transistor 7 is turned on, while first transistor 5 is turned off. The output of first differential amplifier 26 is thus cut off, not affecting the output voltage.

If the output voltage is higher than second reference voltage 29 or the limit voltage, third transistor 7 is turned off, and first transistor 5 is turned on because these transistors 5, 7 have the common source voltage. The output of second differential amplifier 27 is thus cut off, not affecting the output voltage.

As described above, the output voltage of output terminal 32 does not fall short of second reference voltage 29, so that setting this second reference voltage 29 higher than a potential of first power supply terminal 33 eliminates the possibility that the output voltage will be equal to the potential of first power supply terminal 33 under normal conditions. This allows a receiving circuit to judge that a break in a wire or a short circuit to first power supply terminal 33 has occurred when the output voltage has become equal to the potential of first power supply terminal 33.

The supplied limit voltage effected by the operation of the limiter section for the output voltage is accurate and stable with respect to temperature or the like and can be changed easily by changing second reference voltage 29.

In the sensor signal output circuit of the present invention, second reference voltage setting part 38 is formed of fourth transistor 13 having its gate connected to second reference voltage 29, its drain connected to first power supply terminal 33 and its source connected to the input end of second differential amplifier 27, thus advantageously facilitating setting of second reference voltage 29.

In the sensor signal output circuit of this invention, second differential amplifier 27 has a simple structure, which has sixth and seventh transistors 8, 9 having their respective sources connected to each other, and third constant current source 23 connected to the sources of these transistors 8, 9, thus having the advantage of being capable of performing an accurate comparison between the output voltage and second reference voltage 29.

Since the output voltage is input directly to second differential amplifier 27, response is advantageously faster compared with cases where the output voltage is input by way of another circuit or the like.

(Second Exemplary Embodiment)

Referring to FIGS. 2–6, a description is provided hereinafter of the second exemplary embodiment.

Figure 2:
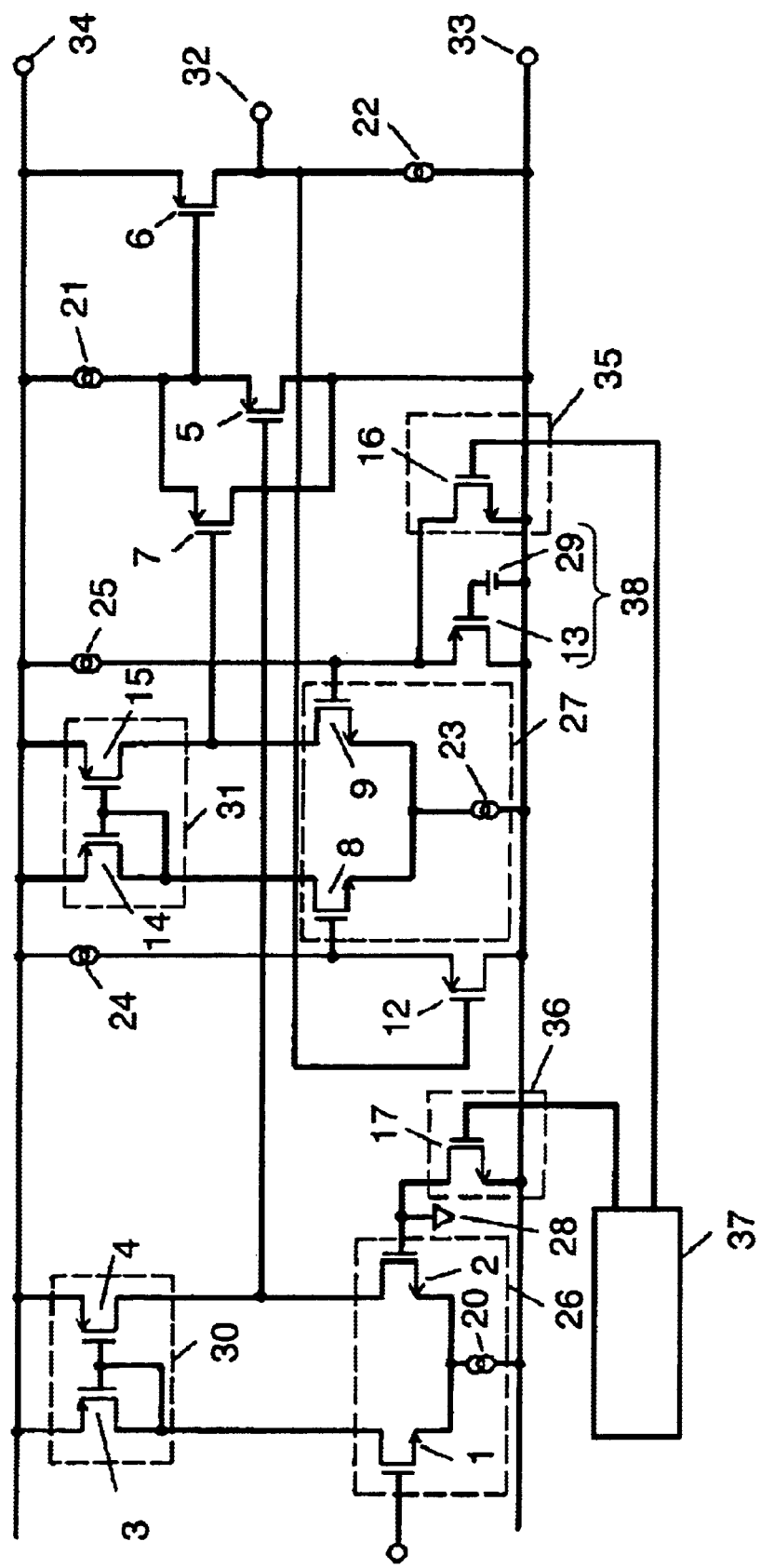
FIG. 2 is a diagram of a sensor signal output circuit in accordance with a second exemplary embodiment of the present invention.

FIG. 2 is a diagram of a sensor signal output circuit in accordance with the present embodiment. Elements similar to those in the first embodiment have the same reference marks, and the descriptions of those elements are omitted.

The second embodiment differs from the first embodiment in that the present embodiment includes limiter disengagement part 35 and output saturation part 36.

Limiter disengagement part 35 is formed of fifth transistor 16 connected in parallel to fourth transistor 13. Output saturation part 36 is formed of tenth transistor 17 provided between first reference voltage setting part 28 and first power supply terminal 33. The operation of limiter disengagement part 35 and the operation of output saturation part 36 are controlled by abnormality detector 37.

Abnormality detector 37 produces a control signal when, for example, a sensor experiences excessive or abnormal disturbance (such as vibration or an electromagnetic wave) during a period from when the sensor starts to when an output reaches a stable region.

A description is provided next of the operation of the sensor signal output circuit of the present embodiment.

If the abnormality detection signal is input from abnormality detector 37 to a gate of fifth transistor 16 when the output voltage is about to become lower than second reference voltage 29 or a limit voltage as a result of an increase in voltage input to a gate of transistor 1, fifth transistor 16 forming limiter disengagement part 35 is turned on, thus establishing a short circuit between a source and a drain of fourth transistor 13. Consequently, voltage between a gate and the source of fourth transistor 13 and second reference voltage 29 are eliminated. Gate voltage of seventh transistor 9 is thus adjusted to a level lower than level-adjusted voltage of sixth transistor 8, decreasing by the voltage between the gate and source of transistor 13 and second reference voltage 29. This means that apparent reference voltage has decreased by the voltage between the gate and source of transistor 13 and second reference voltage 29, so that the output voltage is conditioned to always become higher than second reference voltage 29 or the limit voltage. Here, drain voltage of seventh transistor 9 or an output of second differential amplifier 27 and gate voltage of third transistor 7 increase. Since first and third transistors 5, 7 have common source voltage, third transistor 7 is turned off, while first transistor 5 is turned on, whereby the output of second differential amplifier 27 is cut off, not affecting the output voltage. Consequently, the output voltage responsive to the input can be output even in a region lower than second reference voltage 29, that is, even when the input voltage such as to cause the output voltage to fall short of second reference voltage 29 is input.

Figure 3:
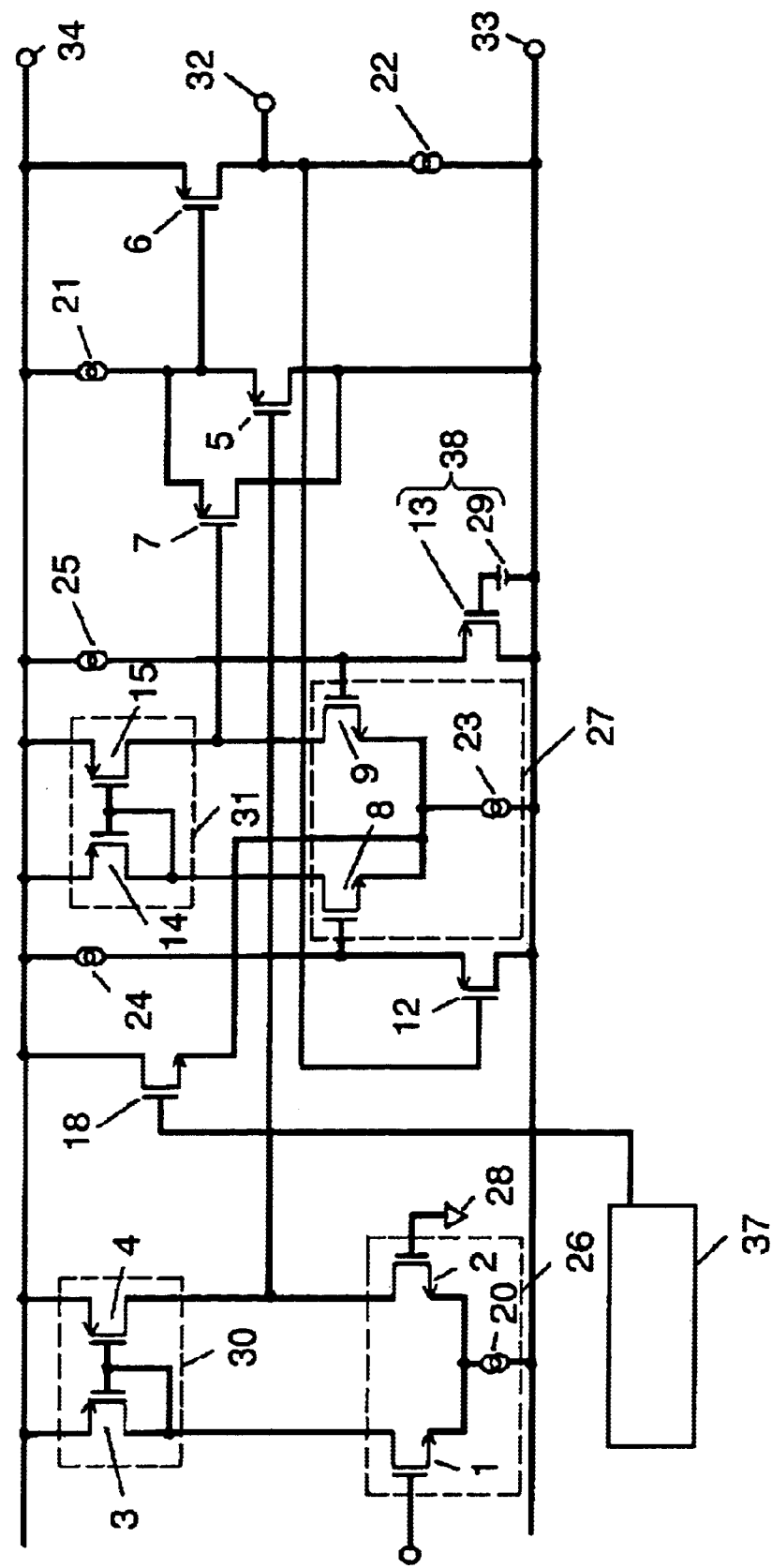
FIG. 3 is a diagram of a sensor signal output circuit in accordance with the second embodiment of the invention.

Limiter disengagement part 35 can have another structure, which is as follows. As shown in FIG. 3, eighth transistor 18 is provided. This transistor 18 has a source connected to common sources of sixth and seventh transistors 8, 9, a drain connected to second power supply terminal 34 and a gate connected to an output end of abnormality detector 37.

Figure 4:
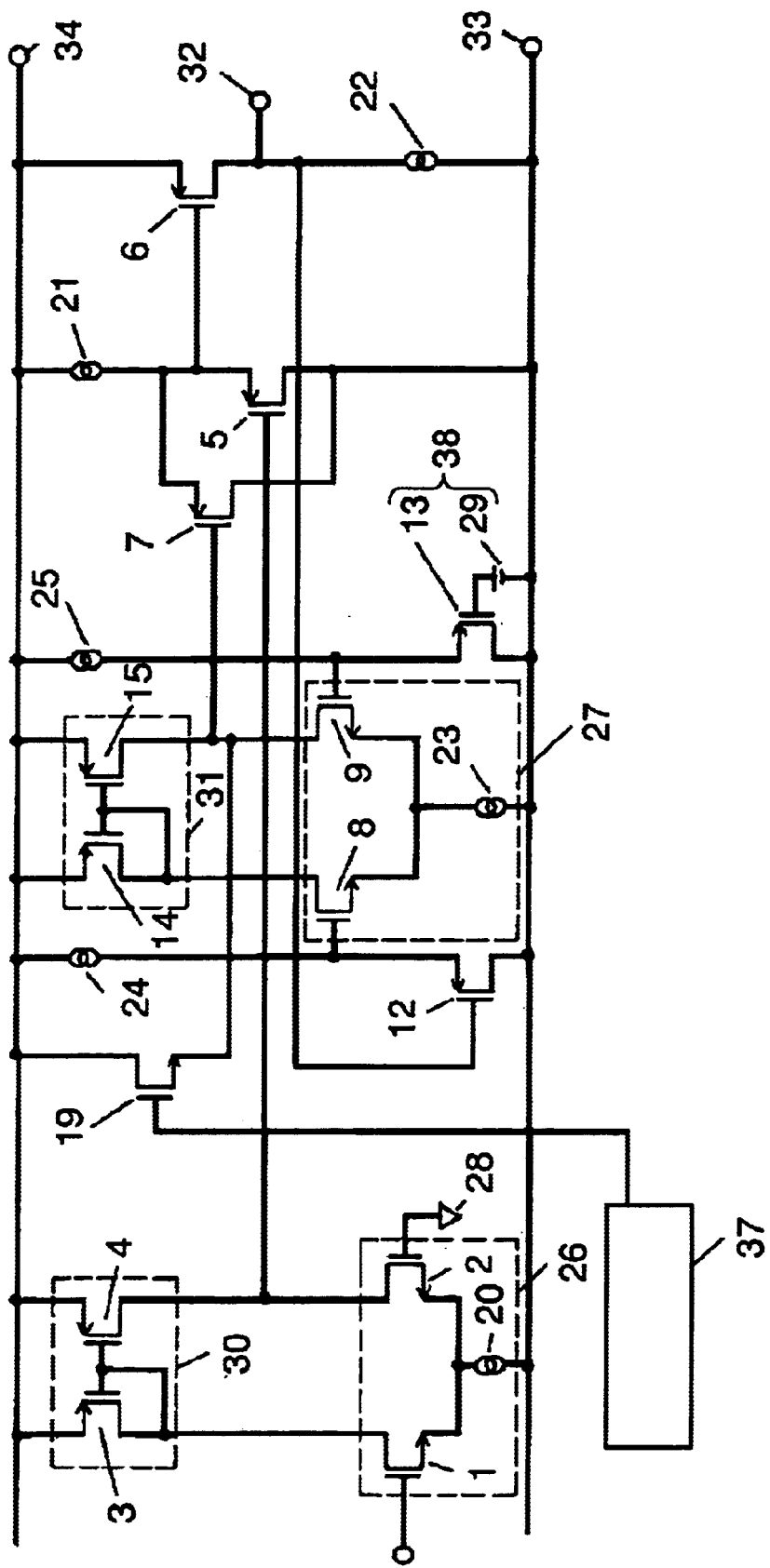
FIG. 4 is a diagram of a sensor signal output circuit in accordance with the second embodiment of the invention.

Limiter disengagement part 35 can have still another structure such as shown in FIG. 4. In other words, ninth transistor 19 is provided. This transistor 19 has a source connected to a gate of third transistor 7, a drain connected to second power supply terminal 34, and a gate connected to the output end of abnormality detector 37. In either of these FIGS. 3 and 4, first and third transistors 5, 7 have common source voltage as in FIG. 2, so that third transistor 7 is turned off, while first transistor 5 is turned on, whereby the output of second differential amplifier 27 is cut off, not affecting the output voltage. Consequently, the output voltage responsive to the input can be output even in a region lower than second reference voltage 29, that is, even when the input voltage such as to cause the output voltage to fall short of second reference voltage 29 is input.

The sensor signal output circuit thus has the advantage of not making a misjudgment as a result of receiving the signal, which is output by the means for inputting the signal to the sensor signal output circuit when, for example, the system is not stable right after power-up or the like.

If abnormality detector 37 provides the abnormality detection output to a gate of tenth transistor 17 of output saturation part 36 and the gate of fifth transistor 16 of limiter disengagement part 35 at the same time, a limiter section is disengaged in the manner described above, and tenth transistor 17 is turned on. Since a gate of transistor 2 is grounded to first power supply terminal 33, the voltage input to the gate of transistor 1 always becomes higher than gate voltage of transistor 2. For this reason, drain voltage of transistor 2 or an output of first differential amplifier 26 and base voltage of first transistor 5, the gate of which is at the same potential as a drain of transistor 2, increase, and the source voltage of transistor 5 also increases. Accordingly, drain voltage of second transistor 6 decreases, whereby the output voltage of output terminal 32 decreases to less than the gate voltage of transistor 2, thus becoming equal to a potential of first power supply terminal 33.

With the above-described structure, the output similar to a voltage resulting from a break in a wire or a short circuit to first power supply terminal 33 can be achieved when the abnormality is detected, so that the information about the detected abnormality can be transmitted to a receiving circuit via signal output terminal 32 without another terminal provided for abnormality detection.

Figure 5:
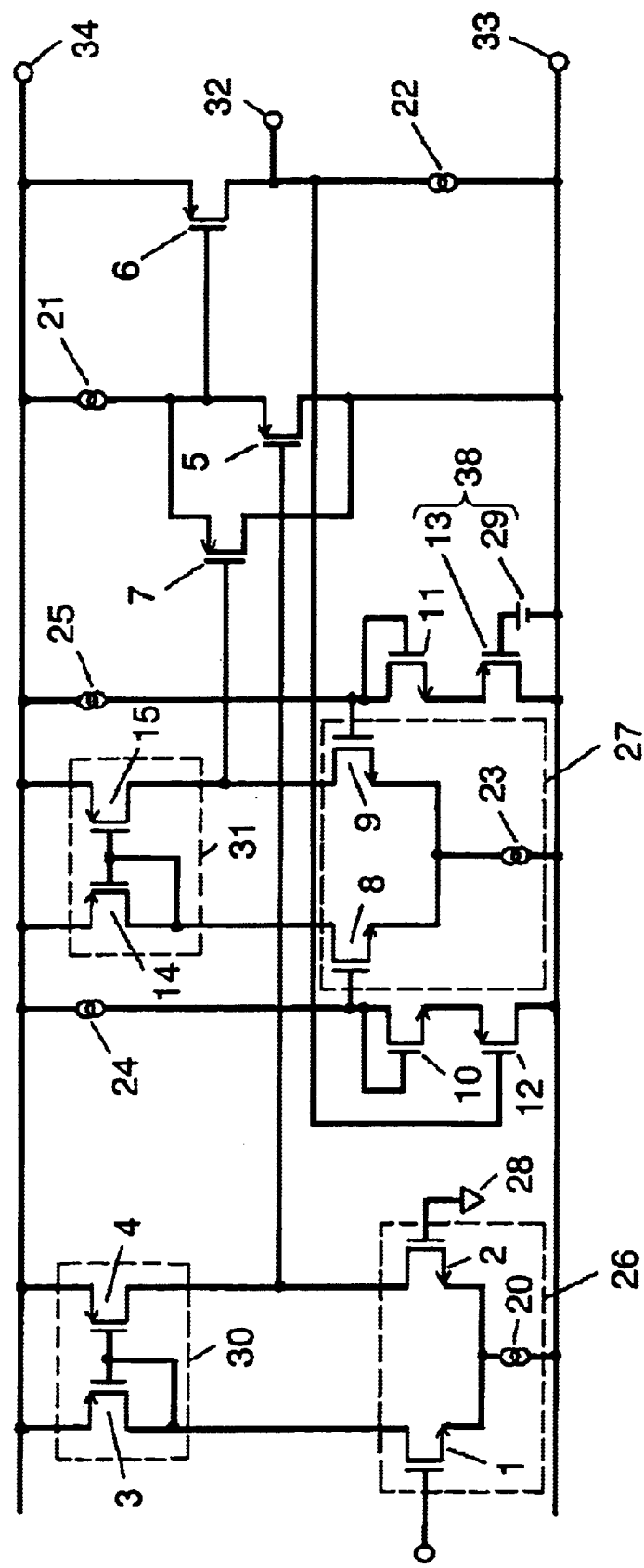
FIG. 5 is a diagram of a sensor signal output circuit in accordance with the second embodiment of the invention.

In the embodiment, the sensor signal output circuit is not provided with a level adjustment part. However, the level adjustment part may be provided on an as needed basis. For example, diode-connected transistors 10, 11 may be used as shown in FIG. 5. In this case, transistor 10 is interposed between sixth transistor 8 and transistor 12, while transistor 11 is interposed between seventh transistor 9 and fourth transistor 13.

Even the use of bipolar transistors (not shown) instead of the transistors used in the embodiment affords the same advantage. In such a case, the source corresponds to an emitter, the drain corresponds to a collector, and the gate corresponds to a base.

Figure 6:
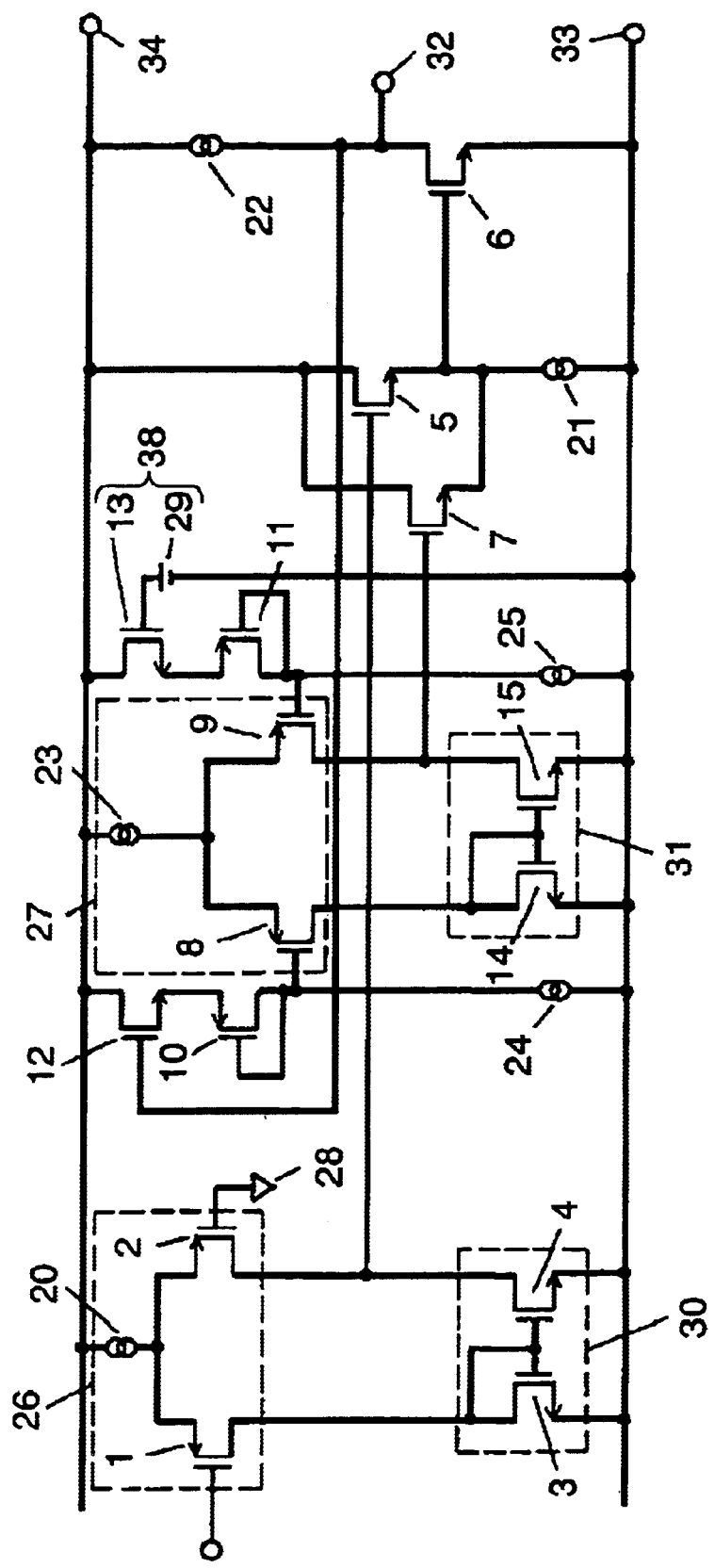
FIG. 6 is a diagram of a sensor signal output circuit in accordance with the second embodiment of the invention.
Figure 7:
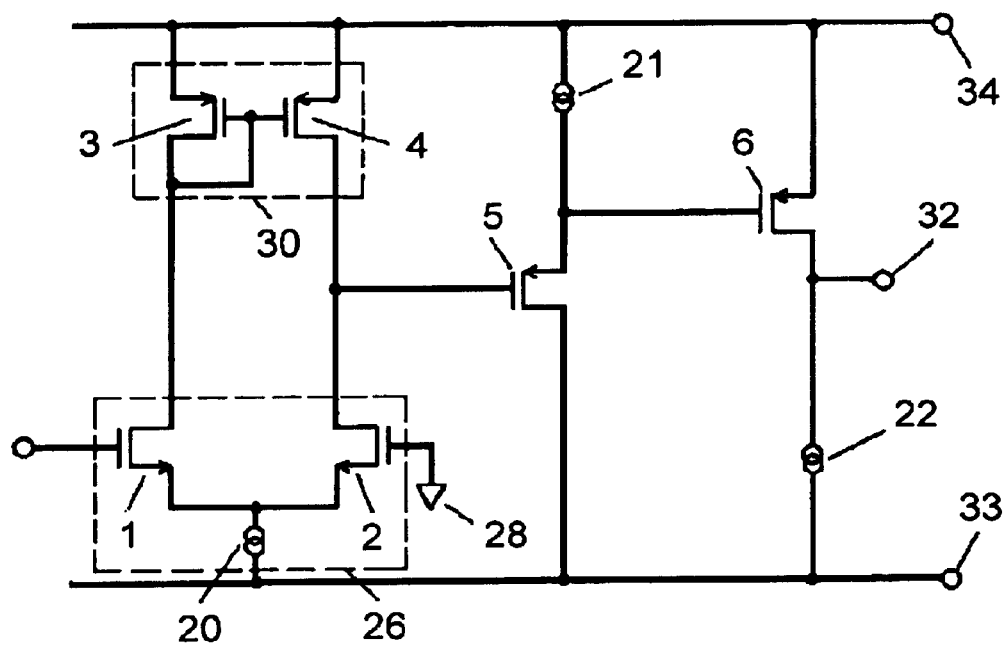
FIG. 7 is a diagram of a conventional sensor signal output circuit.

In cases where all the transistors of FIG. 1 each have P replaced with N and N replaced with P as shown in FIG. 6, an upper limit can be set on the output voltage. In other words, while a limit voltage, that is, a lower limit voltage has been set by second reference voltage setting part 38 in the sensor signal output circuit of the present invention, the upper limit voltage can be set in a similar manner. This provides an advantage that a short circuit to second power supply terminal 34 can be detected without a detection circuit. Even the use of bipolar transistors such as described above provides the same advantage.

In the sensor signal output circuit of the present invention, limiter disengagement part 35 is provided to the limiter section, thus providing the same advantage.

In the sensor signal output circuit of this invention, limiter disengagement part 35 is formed of fifth transistor 16 in parallel with fourth transistor 13 of second reference voltage setting part 38, and this fifth transistor 16 has its drain connected to the source of fourth transistor 13, its source connected to first power supply terminal 33, and its gate serving as an input end for the limiter disengagement signal, thus providing the same advantage.

In another sensor signal output circuit of this invention, limiter disengagement part 35 is formed of eighth transistor 18 having the source connected to the common sources of sixth and seventh transistors 8, 9 of second differential amplifier 27, the drain connected to second power supply terminal 34, and the gate serving as an input end for the limiter disengagement signal, thus providing the same advantage.

In still another sensor signal output circuit of this invention, limiter disengagement part 35 is formed of ninth transistor 19 having the source connected to the gate of third transistor 7, the drain connected to second power supply terminal 34, and the gate serving as an input end for the limiter disengagement signal, thus providing the same advantage.

The sensor signal output circuit of this invention is provided with abnormality detector 37 for operating limiter disengagement part 35 in abnormality, and output saturation part 36 for holding the output voltage at a voltage lower than second reference voltage 29 upon receipt of the abnormality detection signal output from abnormality detector 37, thus providing the advantage that the abnormality other than the break in the wire or the short circuit to first power supply terminal 33 can be detected.

In the sensor signal output circuit of this invention, output saturation part 36 is formed of tenth transistor 17 having its drain connected to the input end (to which the first reference voltage is input) of first differential amplifier 26, its source connected to the potential of first power supply terminal 33, and its gate connected to abnormality detector 37, thus providing the same advantage.

In each of the foregoing embodiments, the sensor is used as the means for inputting the signal to the sensor signal output circuit. However, such means is not limited to the sensor.

As described above, the present invention has the advantage that the break in the wire or the short circuit to first power supply terminal 33 can be detected without the detection circuit.

In other words, since the output voltage of the output terminal does not fall short of second reference voltage 29, setting this reference voltage 29 higher than the potential of first power supply terminal 33 eliminates the possibility that the output voltage will be equal to the potential of first power supply terminal 33 under normal conditions. Thus, the judgment can be made that the break in the wire or the short circuit to first power supply terminal 33 has occurred when the output voltage has become equal to the potential of first power supply terminal 33.

INDUSTRIAL APPLICABILITY

The present invention relates to a sensor signal output circuit used, for example, in a sensor which detects acceleration, angular velocity, pressure or the like. This invention allows detection of a break in a wire or a short circuit to a power supply terminal without a detection circuit.

What is claimed is:

1. A sensor signal output circuit comprising:
    a first differential amplifier including an input end connected to a first reference voltage setting part, and an other input end to which a signal is input;
    a first load resistor for the first differential amplifier;
    a first transistor including a gate connected to an output end of the first differential amplifier, and a source connected to a first constant current source;
    a second transistor including a gate connected to a point of connection between the first constant current source and the first transistor, and a drain connected to a second constant current source;
    an output terminal connected to the drain of the second transistor; and
    a limiter section, the limiter section including at least:
        a second differential amplifier including an input end coupled to the output terminal, and an other input end coupled to a second reference voltage setting part;
        a second load resistor for the second differential amplifier; and
        a third transistor including a gate connected to an output end of the second differential amplifier, and a source connected to the gate of the second transistor.

2. The sensor signal output circuit of claim 1, wherein the limiter section further includes a limiter disengagement part.

3. The sensor signal output circuit of claim 1, wherein the second reference voltage setting part includes a fourth transistor including a gate connected to a second reference voltage, a drain connected to a ground potential, and a source connected to the other input end of the second differential amplifier.

4. The sensor signal output circuit of claim 1, wherein the second differential amplifier includes a sixth and seventh transistors including respective sources connected to each other, and a third constant current source connected to the sources of the sixth and seventh transistors.

5. The sensor signal output circuit of claim 4, wherein the limiter section further includes a limiter disengagement part.

6. The sensor signal output circuit of claim 5, wherein the limiter disengagement part includes a fifth transistor in parallel with a fourth transistor of the second reference voltage setting part, and the fifth transistor includes a drain connected to a source of the fourth transistor, a source connected to a ground potential, and a gate serving as an input end for a limiter disengagement signal.

7. The sensor signal output circuit of claim 5, wherein the limiter disengagement part includes an eighth transistor including a source connected to the common sources of the sixth and seventh transistors of the second differential amplifier, a drain connected to a power supply potential, and a gate serving as an input end for a limiter disengagement signal.

8. The sensor signal output circuit of claim 5, wherein the limiter disengagement part includes a ninth transistor including a source connected to the gate of the third transistor, a drain connected to a power supply potential, and a gate serving as an input end for a limiter disengagement signal.

9. The sensor signal output circuit of claim 5, further comprising:
    an abnormality detector for operating the limiter disengagement part in abnormality; and
    an output saturation part for holding an output voltage at a voltage lower than a second reference voltage upon receipt of an abnormality detection signal output from the abnormality detector.

10. The sensor signal output circuit of claim 9, wherein the output saturation part includes a tenth transistor including a drain connected to the input end of the first differential amplifier that is provided with a first reference voltage, a source connected to a ground potential, and a gate connected to the abnormality detector.

* * * * *